United States Patent
Nakamura et al.

(10) Patent No.: US 9,018,897 B2
(45) Date of Patent: Apr. 28, 2015

(54) ELECTRIC STORAGE DEVICE CONDITION DETERMINATION DEVICE, ELECTRICALLY CHARGEABLE DEVICE, AND METHOD OF DETERMINING ELECTRIC STORAGE DEVICE CONDITION

(75) Inventors: Masashi Nakamura, Kyoto (JP); Takeyuki Shiraishi, Kyoto (JP)

(73) Assignee: GS Yuasa International Ltd., Kyoto (JP)

(*) Notice: Subject to any disclaimer, the term of this patent is extended or adjusted under 35 U.S.C. 154(b) by 348 days.

(21) Appl. No.: 13/485,058

(22) Filed: May 31, 2012

(65) Prior Publication Data
US 2012/0306436 A1  Dec. 6, 2012

(30) Foreign Application Priority Data

Jun. 3, 2011  (JP) ................................. 2011-125604
May 15, 2012  (JP) ................................. 2012-111279

(51) Int. Cl.
*H02J 7/00* (2006.01)
*G01R 31/36* (2006.01)

(52) U.S. Cl.
CPC ........ *G01R 31/3624* (2013.01); *G01R 31/3679* (2013.01); *H02J 7/0073* (2013.01); *H02J 7/0047* (2013.01)

(58) Field of Classification Search
USPC .................................................. 320/107, 132
See application file for complete search history.

(56) References Cited

U.S. PATENT DOCUMENTS

| 6,172,481 B1* | 1/2001 | Curtiss .......................... 320/127 |
| 6,639,386 B2* | 10/2003 | Shiojima ....................... 320/132 |
| 2001/0022518 A1 | 9/2001 | Asakura et al. |
| 2003/0071599 A1 | 4/2003 | Yoo |
| 2011/0291619 A1* | 12/2011 | Asakura ........................ 320/118 |

FOREIGN PATENT DOCUMENTS

| EP | 1263111 | 12/2002 |
| JP | 09-285029 | 10/1997 |
| JP | 11-329512 | 11/1999 |
| JP | 2001-286064 | 10/2001 |
| JP | 2001-289924 | 10/2001 |

(Continued)

OTHER PUBLICATIONS

Extended European Search Report issued on Feb. 28, 2013 filed in European application No. 12004196.7.

(Continued)

*Primary Examiner* — Sun Lin
(74) *Attorney, Agent, or Firm* — Rankin, Hill & Clark LLP (57) ABSTRACT

A condition determination device for determining a condition of an electric storage device includes a current detector, a voltage detector, and a controller. The controller is configured to: determine a level of a first electric factor based on at least one of a charging current detected by the current detector and a charging voltage detected by the voltage detector; obtain first charging time while the level of the first electric factor is constant; determine a level of a second electric factor based on the charging voltage detected by the voltage detector; obtain second charging time while the level of the second electric factor is constant; calculate a determination value based on the first charging time and the second charging time; and determine a condition of the electric storage device based on the determination value.

19 Claims, 7 Drawing Sheets

(56) References Cited

FOREIGN PATENT DOCUMENTS

| JP | 2002-162451 | 6/2002 |
|----|-------------|--------|
| JP | 2003-059544 | 2/2003 |
| JP | 2007-205878 | 8/2007 |
| JP | 2008-193797 | 8/2008 |

OTHER PUBLICATIONS

P. Ramadass et al. "Capacity fade of Sony 18650 cells cycled at elevated temperatures Part I. Cycling performance" Journal of Power Sources, vol. 112, pp. 606-613, Elsevier Science B.V., 2002.

* cited by examiner

ELECTRIC STORAGE DEVICE CONDITION DETERMINATION DEVICE, ELECTRICALLY CHARGEABLE DEVICE, AND METHOD OF DETERMINING ELECTRIC STORAGE DEVICE CONDITION

CROSS REFERENCE TO RELATED APPLICATION

This application claims priority from Japanese Patent Applications No. 2011-125604 filed on Jun. 3, 2011 and No. 2012-111279 filed on May 15, 2012. The entire content of these priority applications is incorporated herein by reference.

TECHNICAL FIELD

The present invention relates to a technology for determining conditions of electric storage devices to detect certain conditions such as deterioration.

BACKGROUND

Electric storage devices that are rechargeable for repeated use, such as secondary batteries, are known. The electric storage devices are currently used in various fields including electric vehicles and more various fields are expected.

In such an electric storage device, an internal resistance may increase or a storage capacity may decrease due to deterioration as the number of times that the electric storage device is used increases. When the internal resistance is increased, the electric storage device may not be able to provide expected performance, for instance, required maximum voltage and power may not be achieved. A device including such an electric storage device may malfunction due to a voltage decrease. To resolve such a problem, a technology for determining conditions of a battery to detect certain conditions such as deterioration is known. In this technology, degradation of the battery is detected based on battery charging time during which the battery is charged with a constant current. Another technology for determining conditions of a battery based on a measured battery capacity is also known. According to the technology for determining conditions of the battery based on the battery charging time, continuous measurement of a charging current from a fully discharged condition to a fully charged condition is not required. Therefore, the degradation of the battery can be relatively easily detected.

As the variety of fields in which the electric storage devices are used increases, expectations for an improvement in accuracy of the condition determination for the electric storage devices increase.

The present invention has been made in consideration of the above circumstances, and an object thereof is to provide a technology for determining conditions of electric storage devices.

SUMMARY

A condition determination device according to technologies described herein is for determining a condition of an electric storage device. The condition determination device includes a current detector, a voltage detector, and a controller. The current detector is configured to detect a charging current for charging the electric storage device. The voltage detector is configured to detect a charging voltage for charging the electric storage device. The controller is configured to: determine a level of a first electric factor based on at least one of the charging current detected by the current detector and the charging voltage detected by the voltage detector; obtain first charging time while the level of the first electric factor is constant; determine a level of a second electric factor based on the charging voltage detected by the voltage detector; obtain second charging time while the level of the second electric factor is constant; calculate a determination value based on the first charging time and the second charging time; and determine a condition of the electric storage device based on the determination value.

In this condition determination device, the determination value is calculated for the determination of the electric storage condition based on the first charging time and the second time. For example, the determination value is calculated by subtracting the second charging time from the first charging time. With this configuration, a variation in determination value due to deterioration of the electric storage device is larger than a variation in constant current charging time due to the deterioration of the electric storage device. When the determination value is calculated based on the first charging time and the second charging time, the variation in determination value due to a variation in condition of the electric storage device is clearly recognizable. With such a determination value, a condition of the electric storage device can be accurately determined.

An electrically chargeable device according to technologies described herein includes an electric storage device and the condition determination device described above. With this electrically chargeable device, a condition of the electric storage device can be accurately determined based on the determination valued calculated from the first charging time and the second charging time.

A method of determining a condition of an electric storage device according to the technologies described herein includes: measuring a charging current and a charging voltage; determining a level of a first electric factor based on at least one of the charging current and the charging voltage; obtaining first charging time while the first electric factor is constant during charging the electric storage device; determining a level of a second electric factor based on the charging voltage; obtaining second charging time while the second electric factor is constant during charging the electric storage device after the measurement of the first charging time; calculating a determination value based on the first charging time and the second charging time; and determining a condition of the electric storage device based on the determination value.

In this method, the determination value for determining a condition of the electric storage device is calculated based on the first charging time and the second charging time. Therefore, a variation in determination value due to a variation in condition of the electric storage device is larger than a variation in constant current charging time due to a variation in condition of the electric storage device. With this determination value, a condition of the electric storage device can be accurately determined.

According to the technologies described herein, a condition of the electric storage device can be properly determined.

BRIEF DESCRIPTION OF THE DRAWINGS

Illustrative aspects in accordance with the invention will be described in detail with reference to the following figures.

DETAILED DESCRIPTION

First Embodiment

Figure 1:
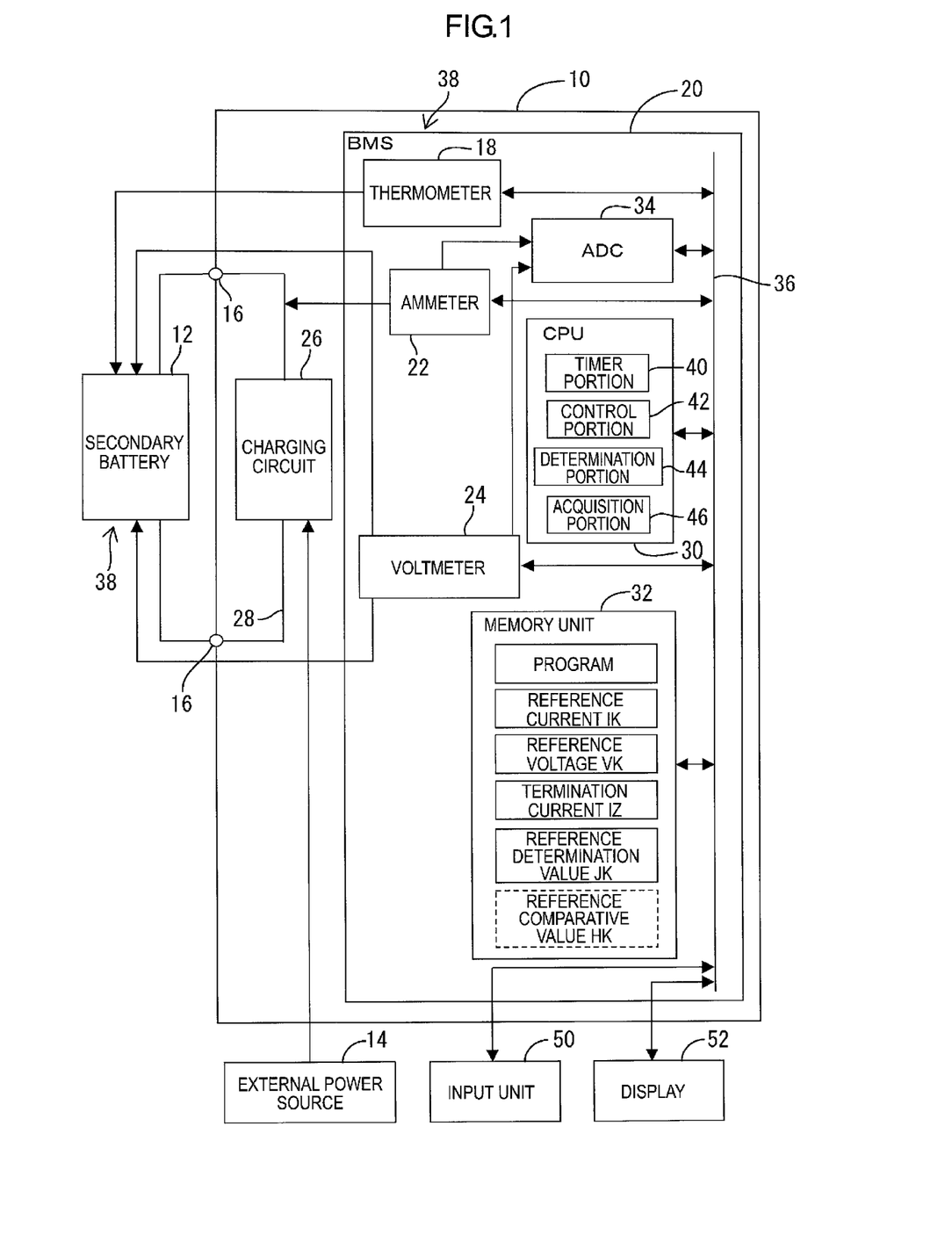
FIG. 1 is a block diagram of a condition determination device according to embodiments.

An embodiment will be explained with reference to FIGS. 1 to 5.
1. Configuration A charging device 10 illustrated in FIG. 1 is configured to charge a secondary battery 12 (an electric storage device) when the secondary battery 12 is connected thereto. The charging device 10 includes a battery management system (BMS) 20 for determining conditions of the secondary battery 12 (a condition determination device), for instance, degradation of the second battery 12. An electrically chargeable device 38 includes the secondary battery 12 and the BMS 20. The electrically chargeable device 38 is configured to charge the secondary battery 12 and to determine conditions of the secondary battery 12. In this embodiment, a lithium ion battery is used for the secondary battery 12.

As illustrated in FIG. 1, the charging device 10 includes the BMS 20, a charging circuit 26, and charging wires 28. The charging circuit 26 is provided outside the BMS 20. The charging circuit 26 is connected to an external power source 14 and configured to feed power from the external power source 14 to the secondary battery 12 via connecting terminals 16 and the charging wires 28.

The BMS 20 includes a central processing unit (CPU) 30, a memory unit 32, an analog-to-digital converter (ADC) 34, a thermometer 18, an ammeter 22 (a current detector), a voltmeter 24 (a voltage detector), and a bus 36. The memory unit 32 includes a ROM and a RAM. The bus 36 connects the CPU 30, the memory unit 32, the ADC 34, the thermometer 18, the ammeter 22, and the voltmeter 24.

The memory unit 32 stores various programs for controlling operations of the charging device 10. The CPU 30 includes a timer portion 40, a control portion 42, a determination portion 44, and an acquisition portion 46. The CPU 30 controls the operations of the charging device 10 and sends signals to the charging circuit 26.

The thermometer 18 is a contact-type thermometer or a non-contact-type thermometer configured to measure a temperature of the secondary battery 12. Data on the measured temperature Y is sent to the memory unit 32 via the bus 36 and stored in the memory unit 32. The ammeter 22 measures a charging current and a discharging current (hereinafter each may be referred to as a current) flowing through the secondary battery 12 via the charging wires 28 every predetermined period. Data on the measured current I is sent to the ADC 34. The voltmeter 24 is connected to ends of the secondary battery 12 and configured to measure a voltage across the ends of the secondary battery 12. Data on the measured voltage V is sent to the ADC 34. The voltmeter 24 is configured to directly measure the voltage across the ends of the secondary battery 12 without using the charging wires 28. Namely, a charging voltage and a discharging voltage (hereinafter each may be referred to as a voltage) can be accurately measured without affected by resistances of the charging wires 28.

The ADC 34 is connected to the ammeter 22 and the voltmeter 24. The ADC 34 converts the analog data on the current I and the voltage V to digital data. The analog data is sent from the ammeter 22 and the voltmeter 24, respectively. The digital data on the current I and the voltage V are? sent to the memory unit 32 via the bus 36 and stored in the memory unit 32. The CPU 30 performs control, determination, and acquisition using the control portion 42, the determination portion 44, and the acquisition portion 46. For the control, the determination, and the acquisition, the CPU 30 uses the current data and the voltage data.

The charging device 10 further includes an input unit 50 and a display 52. A user can input data through the input unit 50. The display 52 is a liquid crystal display configured to display conditions of the charging device 10 and determination results.

2. Condition Determination Process

Figure 2:
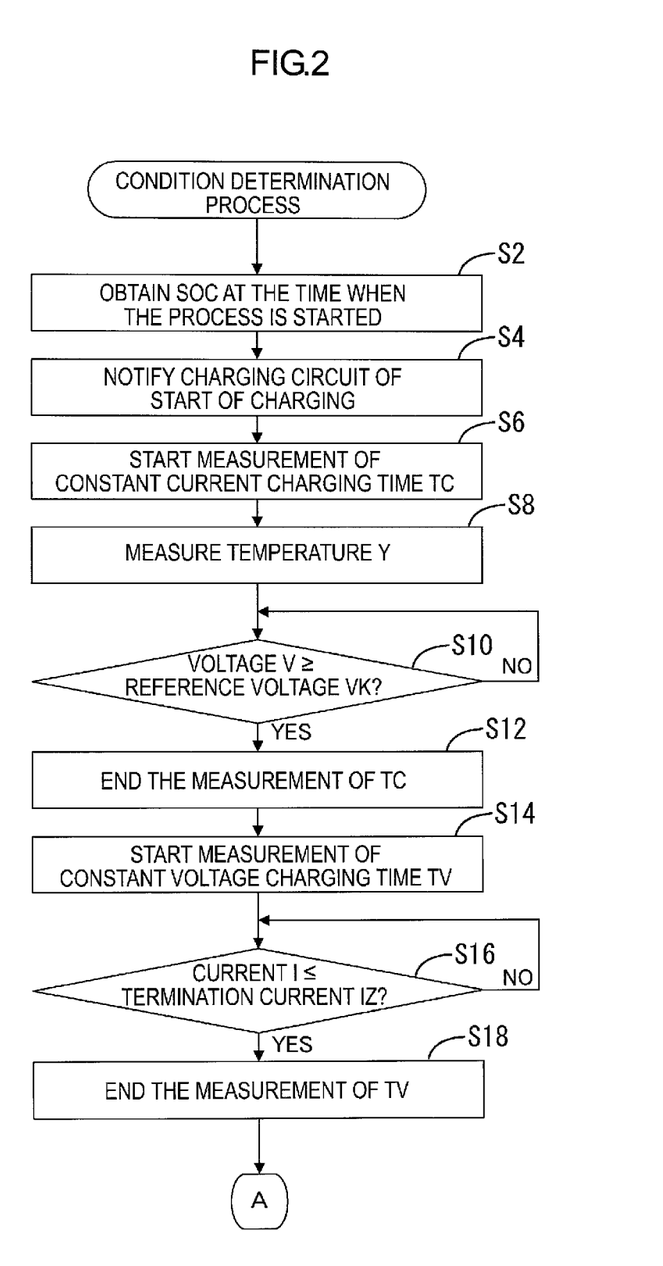
FIG. 2 is a flowchart of a condition determination process according to the embodiments
Figure 3:
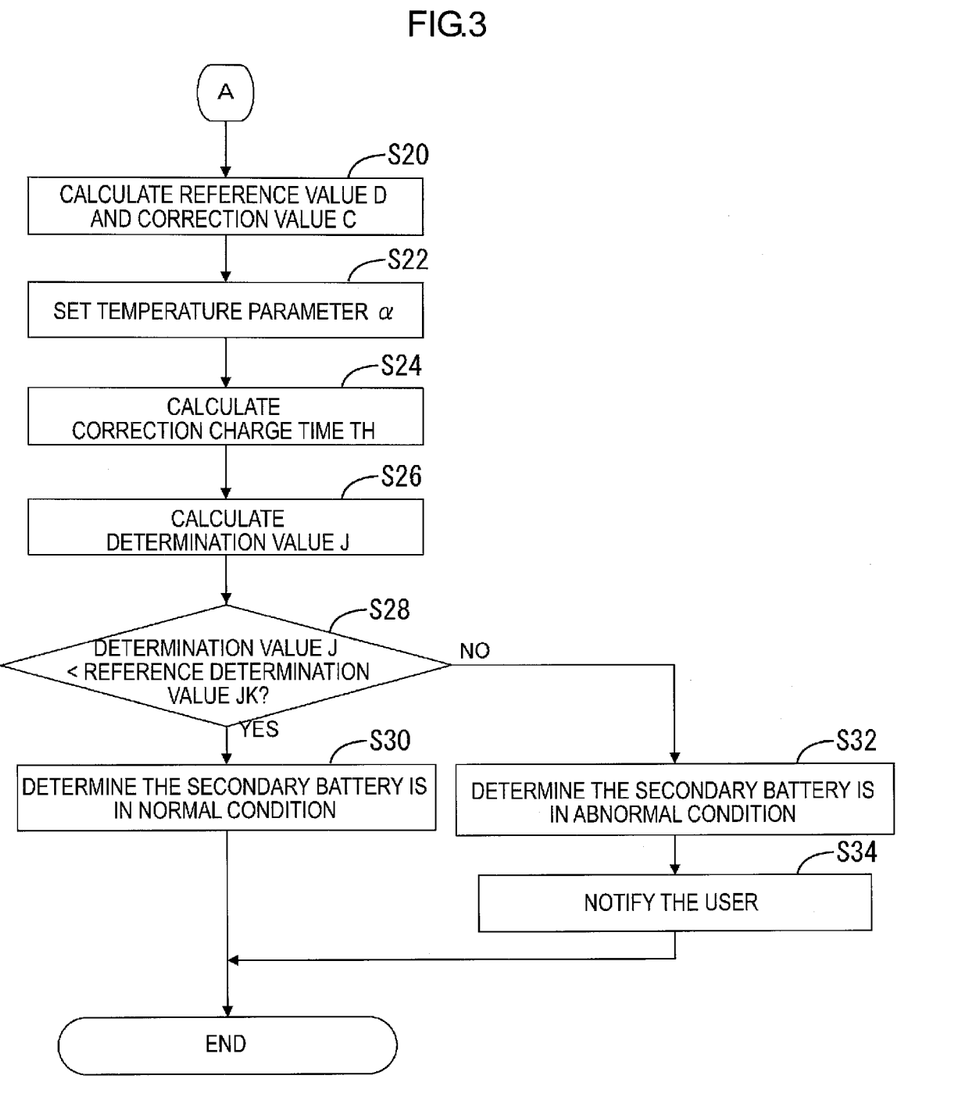
FIG. 3 is a flowchart of a condition determination process according to a first embodiment.
Figure 4:
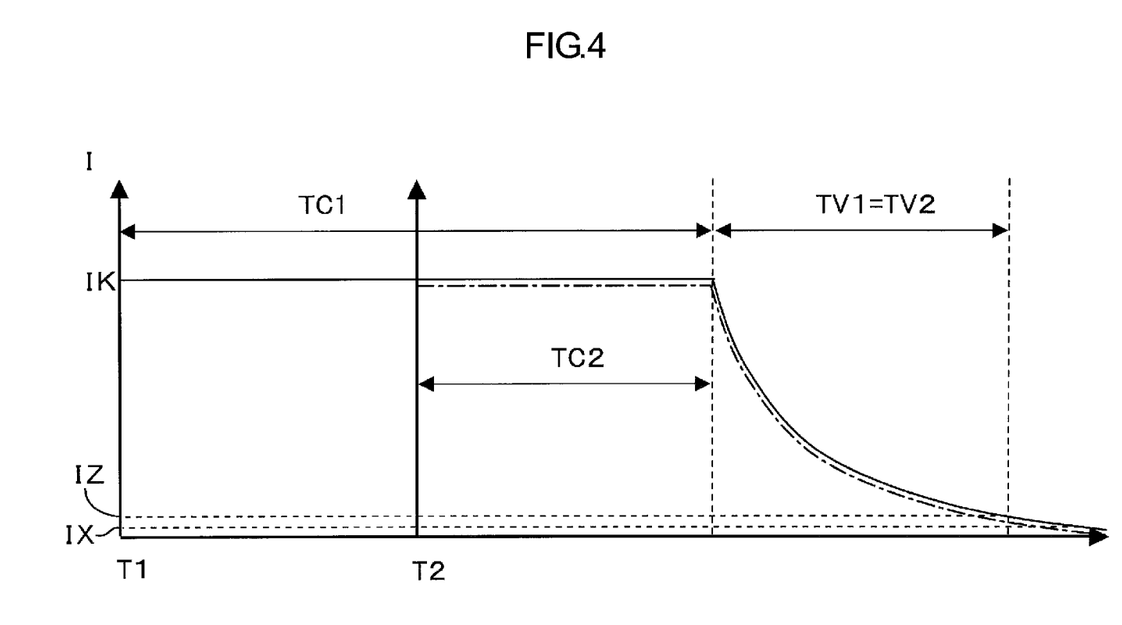
FIG. 4 is a graph illustrating variations in currents flowing through secondary batteries during the condition determination process.

A condition determination process performed by the BMS 20 during the charge of the secondary battery 12 by the charging device 10 will be explained with reference to FIGS. 2 to 4. In this embodiment, the secondary battery 12 is charged with constant voltage after being charged with constant current. Measurement of currents is performed on two different secondary batteries 12 in the same deterioration condition but in different charged conditions. Variations in measured currents are illustrated in FIG. 4. In FIG. 4, a solid line indicates a current flowing through the secondary battery 12 during the charge from a fully discharged condition, which is a reference condition. Symbol T1 indicates elapsed time of the charge from the fully discharged condition. A chain line indicates a current flowing through the secondary battery 12 during the charge from a 50% charged condition, that is, a state of charge (SOC) is 50%. Symbol T2 indicates elapsed time of the charge from the 50% charged condition.

When an instruction for charging the secondary battery 12 is input by the user through the input unit 50, the CPU executes the condition determination process according to the program stored in the memory unit 32. After the process is started, the CPU 30 obtains the SOC at the time when the process is started using the acquisition portion 46 (S2). The SOC and the voltage V are associated with each other and stored in the memory unit 32. The CPU 30 measures the voltage V of the secondary battery 12 at the time when the process is started using the voltmeter 24. The CPU 30 obtains the SOC associated with the measured voltage V and set as an initial SOC (an initial value) expressed in percentage (%) at the time when the process is started. The SOC data obtained in step S2, which will be explained later, is set as the initial SOC immediately before the constant current charge is started. Namely, the initial SOC corresponds to the SOC at the time when measurement of the constant current charging time TC is started.

The CPU 30 notifies the charging circuit 26 of the input of the instruction for charging the secondary battery 12 (S4), and the charging circuit 26 starts charging the secondary battery 12. The charging circuit 26 performs a constant current charge to charge the secondary battery 12 with a constant current flowing through the secondary battery 12 equal to a reference current IK. The CPU 30 starts measurement of constant current charging time TC during which the secondary battery 12 is charged with the constant current (S6). The constant current charging time TC may be referred to as a first charging time. The reference current IK is stored in the memory unit 32 in advance. The CPU 30 monitors a level of the current (a level of a first electric factor) flowing through the secondary battery 12 with measurements of the ammeter 22. When a current I flowing through the secondary battery 12 reaches the reference current IK, the CPU 30 starts measuring time. The CPU 30 measures the temperature Y of the secondary battery 12 using the thermometer 18 (S8).

During the constant current charge of the secondary battery 12, the CPU 30 monitors a level of the voltage (a level of a second electric factor) applied to the secondary battery 12 with measurement of the voltmeter 24 using the control portion 42 (if NO in step S10). A reference voltage VK is stored in the memory unit 32 in advance. When the voltage applied to the secondary battery 12 reaches the reference voltage VK (YES in step S10), the CPU 30 ends the measurement of the constant current charging time TC and stores the measured constant current charging time TC in the memory unit 32 (S12).

When the voltage applied to the secondary battery 12 exceeds the reference voltage VK, the charging circuit 26 performs a constant voltage charge to charge the secondary battery 12 with a constant voltage applied to the secondary battery 12 equal to the reference voltage VK. As illustrated in FIG. 4, the current flowing through the secondary battery 12 gradually decreases from the reference current IK immediately after the start of the constant voltage charge as the charge progresses. The CPU 30 starts measuring constant voltage charging time TV during which the secondary battery 12 is charged with the constant voltage (S14). The constant voltage charging time TV may be referred to as a second charging time. The CPU 30 starts the measurement of the constant voltage charging time TV since the end of the measurement of the constant current charging time TC using the timer portion 40.

During the constant voltage charge of the secondary battery 12, the CPU 30 monitors the level the current flowing through the secondary battery 12 with the measurements of the ammeter 22 using the control portion 42 (if NO in step S16). A termination current IZ is stored in the memory unit 32 in advance. When the current flowing through the secondary battery 12 drops below the termination current IZ (YES in step S16), the CPU 30 ends the measurement of the constant voltage charging time TV and stores the measured constant voltage charging time TV in the memory unit 32 (S18). When the current flowing through the secondary battery 12 becomes equal to a charge termination current IX, the charging circuit 26 terminates the charge. The charge termination current IX is set lower than the termination current IZ.

The termination current IZ is set based on assumed noise that may occur in the charging wires 28 of the charging device 10. In this embodiment, the termination current IZ is set higher than a variation in current flowing through the second battery 12 due to the noise in the charging wiring 28. With this configuration, the measurement of the constant voltage charging time TV is less likely to be terminated due to the noise that may irregularly occur.

The CPU 30 determines the condition of the secondary battery 12 based on the SOC, the measured temperature Y, the measured constant current charging time TC, and the measured constant voltage charging time TV using the determination portion 44.

The CPU 30 calculates a reference value D and a correction value C (S20). The reference value D is calculated by subtracting the SOC in the reference condition from 100%. In this embodiment, the reference condition is the fully discharged condition. Therefore, the reference value is 100%. The correction value C is calculated by subtracting the initial SOC from 100% and diving the reference value D by the result of the subtraction. The CPU 30 sets a temperature parameter α based on the measured temperature Y (S22). The temperature parameter α is set to a small value when the measured temperature Y is high and so as to increase as the measured temperature Y decreases. The CPU 30 calculates a correction charge time TH as follows based on the constant current charging time TC, the correction value C, and the temperature parameter α (S24).

$$C=D/(100-\text{initial SOC})$$

$$TH=TC \cdot \alpha \cdot [100/(100-\text{initial SOC})]$$

If the secondary battery 12 is in the fully discharged condition, that is, the initial SOC of the secondary battery 12 is 0% (see the solid line in FIG. 4), the correction charge time TH is equal to time calculated by multiplying the constant current charging time TC by the temperature parameter α. If the initial SOC of the second battery 12 is 50% (see the chain line in FIG. 4), the correction charge time TH is equal to time calculated by multiplying the constant current charging time TC2 by 2. As illustrated in FIG. 4, the constant current charging time TC2 for charging the secondary battery 12 with the SOC of 50% is a half of the constant current charging time TC1 for charging the secondary battery 12 with the SOC of 0%. The correction charge time TH is constant regardless of the initial SOC. Namely, the correction charge time TH is equal to time converted from the constant current charging time TC measured during the charge of any secondary battery 12 with any SOC to the constant current charging time TC for charging the secondary battery 12 from the fully discharged condition.

The CPU 30 calculates a determination value J by dividing the constant voltage charging time TV by the correction charge time TH (S26). If the secondary battery 12 is in the fully discharged condition, the determination value J is calculated by dividing the constant voltage charging time TV by the temperature parameter α and the constant current charging time TC. As illustrated in FIG. 4, the constant voltage charging time TV1 (or TV2) is constant regardless of the initial SOC. As described earlier, the correction charge time TH is constant regardless of the initial SOC. Therefore, the determination value J calculated based on the constant voltage charging time TV and the correction charge time TH is also constant.

$$J=TV/TH$$

The memory unit 32 stores a reference determination value JK in advance. The CPU 30 compares the calculated determination value J with the reference determination value JK, and determines the condition of the secondary battery 12 (S28). If the determination value J is smaller than the reference determination value JK (YES in step S28), the CPU 30 determines that the secondary battery 12 is in a normal condition (S30) and terminates the process. If the determination value J is equal to or larger than the reference determination value JK, (NO in step S28), the CPU 30 determines that the secondary battery 12 is in an abnormal condition (S32) and notifies the user of the secondary battery 12 being in the abnormal condition through the display 52 (S34). Then, the CPU 30 terminates the process.

Figure 5:
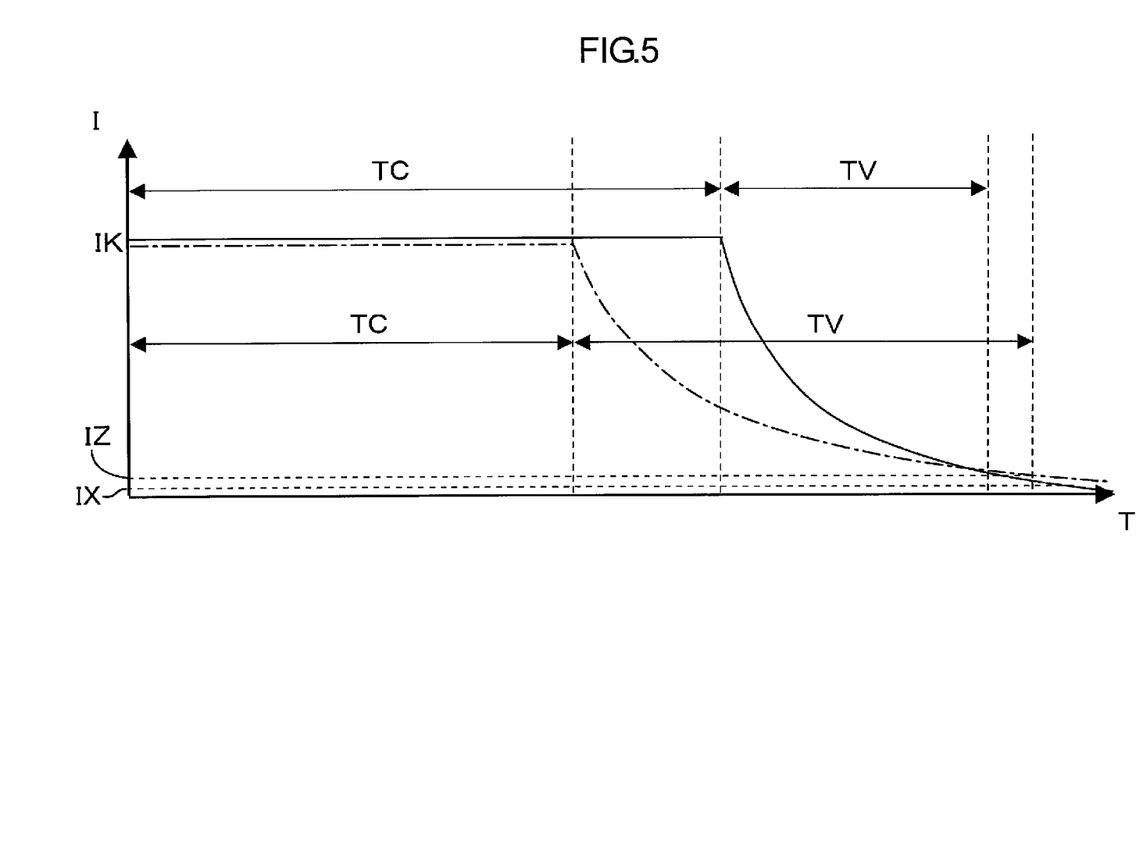
FIG. 5 is a graph illustrating variations in currents flowing through the secondary batteries during the condition determination process.

Variations in current flowing through the secondary battery 12 in a certain deterioration condition and the secondary battery 12 in another deterioration condition measured in the condition determination process are illustrated in FIG. 5. The fully discharged secondary batteries 12 are used in the measurement. In FIG. 5, a solid line indicates a variation in current flowing through the secondary battery 12 with relatively light deterioration. A chain line indicates a variation in current flowing through the secondary battery 12 with relatively heavy deterioration.

As illustrated in FIG. 5, the secondary battery 12 requires longer constant voltage charging time TV as the deterioration progresses but shorter constant current charging time TC. In the condition determination process, the determination value J is calculated by dividing the constant voltage charging time TV by the constant current charging time TC. Furthermore, the determination value J is compared with the reference determination value JK. Through this process, an abnormal condition such as deterioration can be accurately determined.

3. Effects (1) In the charging device 10, the determination value J is calculated based on the constant current charging time TC and the constant voltage charging time TV. Specifically, the determination value J is calculated by dividing the constant voltage charging time TV by the constant current charging time TC. Therefore, a variation in the determination value J due to the deterioration of the secondary battery 12 is larger than a variation in the constant current charging time TC due to the deterioration of the secondary battery 12. With this configuration, the battery condition can be accurately determined.

(2) In the charging device 10, the condition of the secondary battery 12 is determined based on the measured constant current charging time TC and the measured constant voltage charging time TV. This configuration can be applied to any device having a charging time measurement function. Namely, high-speed operation or high-accuracy measurement is not required. According to the charging device 10, the condition of the secondary battery 12 can be accurately determined at low cost using a simple algorithm.

(3) The CPU 30 obtains the initial SOC of the secondary battery 12 and calculates the correction charging time TH based on the constant current charging time TC and the obtained initial SOC. The correction charging time TH corresponds to the constant current charging time TC elapsed for charging the secondary battery 12 from the fully discharged condition. With this configuration, the battery condition can be accurately determined regardless of the initial SOC.

(4) In the charging device 10, the CPU 30 measures the temperature Y of the secondary battery 12 at the start of the charge for the calculation of the determination value J. The CPU 30 calculates the temperature parameter α based on the measured temperature Y, and then calculates the determination value J based on the temperature parameter α. The constant current charging time TC tends to decrease as the temperature decreases and to increase as the temperature increases. The constant voltage charging time TV tends to increase as the temperature decreases and to decrease as the temperature increases. Namely, temperature characteristics are different between the constant current charging time TC and the constant voltage charging time TV. By calculating the determination value J based on the temperature parameter α, the difference between the constant current charging time TC and the constant voltage charging time TV caused by the different temperature characteristics thereof can be compensated. Therefore, the condition of the secondary battery 12 can be accurately determined regardless of the temperature of the secondary battery 12.

Second Embodiment

Figure 6:
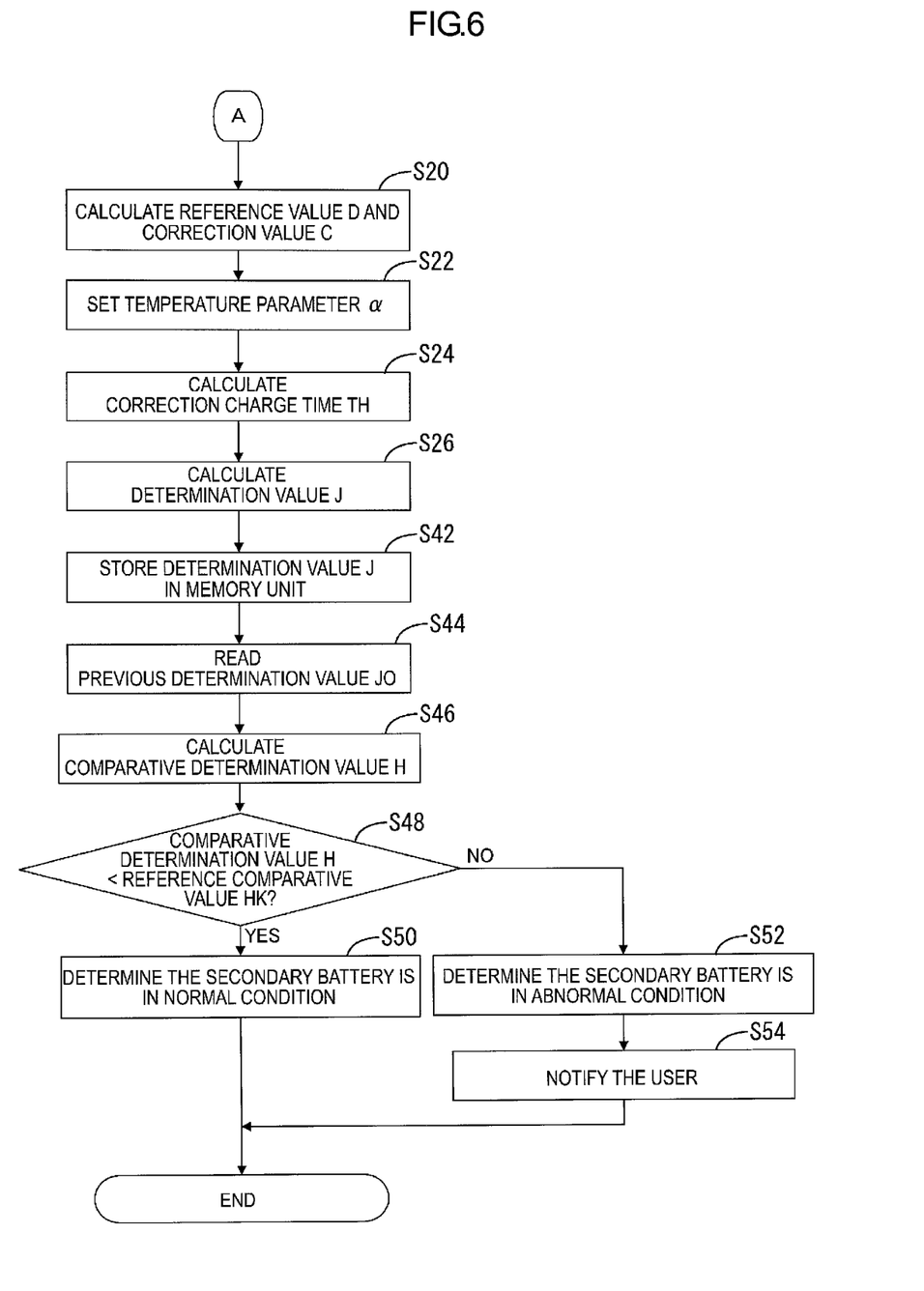
FIG. 6 is a flowchart of a condition determination process according to a second embodiment.

A second embodiment will be explained with reference to FIG. 6. As illustrated in FIG. 6, a comparative determination value H is used for condition determination of the secondary battery 12 in the charging device 10 of this embodiment. The comparative determination value H is calculated by dividing a determination value J calculated in the current condition determination process by a determination value JO calculated in the previous condition determination process. Other configurations of the charging device 10 are the same as those of the first embodiment.

In the charging device 10 of this embodiment repeatedly executes the condition determination process for a specific one of the secondary batteries 12. The CPU 30 stores the determination values J calculated in the condition determination processes in the memory unit 32. The CPU 30 counts the number of times that the condition determination process is executed for the specific secondary battery 12. Then, the CPU 30 associates the number of times with the determination values J and stores the determination values J in the memory unit 32. In the following description, configurations, functions, and effects that are the same as the first embodiment will not be explained.

1. Condition Determination Process

After the calculation of the determination value J (S26), the CPU 30 associates the number of times of the determination with the determination value J and stores the determination value J with the associated number in the memory unit 32 (S42). The CPU 30 reads the previous determination value JO with the associated number indicating the previous time of the determination out of the memory unit 32 (S44). Then, the CPU 30 calculates the comparative determination value H by dividing the determination value J by the previous determination value JO (S46).

$$H = J/JO$$

The memory 32 stores a reference comparative value HK determined based on an assumed aging condition. The CPU 30 compares the calculated comparative determination value H with the reference comparative value HK (S48). If the comparative determination value H is smaller than the reference comparative value HK (YES in step S48), the CPU 30 determines that deterioration heavier than aging has not been caused by any factor such as a breakage in the secondary battery 12 since the previous condition determination process (S50), and terminates the process. If the comparative determination value H is equal to or larger than the reference comparative value HK (NO in step S48), the CPU 30 determines that deterioration heavier than aging has been caused by any other factor in the secondary battery 12 (S52). The CPU 30 notifies the user of the deterioration through the display 52 (S54) and then terminates the process.

2. Effects

In the charging device 10 of this embodiment, the condition of the secondary battery 12 is determined based on the comparative determination value H calculated by dividing the current determination value J by the previous determination value JO. With this configuration, a variation in battery condition since the previous condition determination can be accurately determined. If the current determination value J is larger than the previous determination value JO, that is, the comparative determination value H is larger than 1, failures may have occurred in the BMS. By using the comparative determination value H for the determination of the condition of the secondary battery 12, a malfunction of the BMS can be detected.

Third Embodiment

A third embodiment will be explained with reference to FIG. 7. In the charging device 10 of this embodiment, the secondary battery 12 is charged first with a constant voltage and then with a constant current. Other configurations are the same as those of the first embodiment.

1. Condition Determination Process

When the charge of the secondary battery 12 is started, the charging circuit 26 sets power supplied to the secondary battery 12 to a constant level equal to a reference power WK, and charges the secondary battery 12 with the constant power. The CPU 30 monitors a level of the current flowing through the secondary battery 12 with the measurements of the ammeter 22 and a level of the voltage applied to the secondary battery 12 with the measurements of the voltmeter 24. Namely, the CPU 30 monitors a level of the power (a level of a first electric factor). The CPU 30 starts the measurement of the constant power charging time TW using the timer portion 40. The CPU 30 measures the constant power charging time TW while the level of the power is constant. The constant power charging time TW may be referred to as a first charging time.

During the constant power charge of the secondary battery 12, the CPU 30 monitors the level of the voltage applied to the secondary battery 12 with the measurements of the voltmeter 24. When the voltage applied to the secondary battery 12 reaches the reference voltage VK, the CPU 30 ends the measurement of the constant power charging time TW and stores the measured constant power charging time TW in the memory unit 32.

When the voltage applied to the secondary battery 12 exceeds the reference voltage VK, the charging circuit 26 sets the voltage applied to the secondary battery 12 to the reference voltage VK, and charges the secondary battery 12 with a constant voltage. The CPU 30 starts the measurement of the constant voltage charging time using the timer portion 40. The CPU 30 measures the constant voltage charging time while the voltage is constant. The rest of the process is similar to the corresponding part of the process in the first embodiment using the constant current charging time TC. Namely, the constant current charging time TC is replaced by the constant power charging time TW in the process of this embodiment. Specifically, the CPU 30 calculates the correction charging time TH based on the constant power charging time TW, and then calculates the determination value J based on the correction charging time TH and the constant voltage charging time TV. The CPU 30 determines the condition of the secondary battery 12 based on the determination value J.

2. Effects

Measurement of currents is performed on two different secondary batteries 12 in different deterioration condition in the condition determination process. Variations in measured currents are illustrated in FIG. 7. In FIG. 7, a solid line indicates a variation in current flowing through the secondary battery 12 with relatively light deterioration. A chain line indicates a variation in current flowing through the secondary battery 12 with relatively heavy deterioration.

Figure 7:
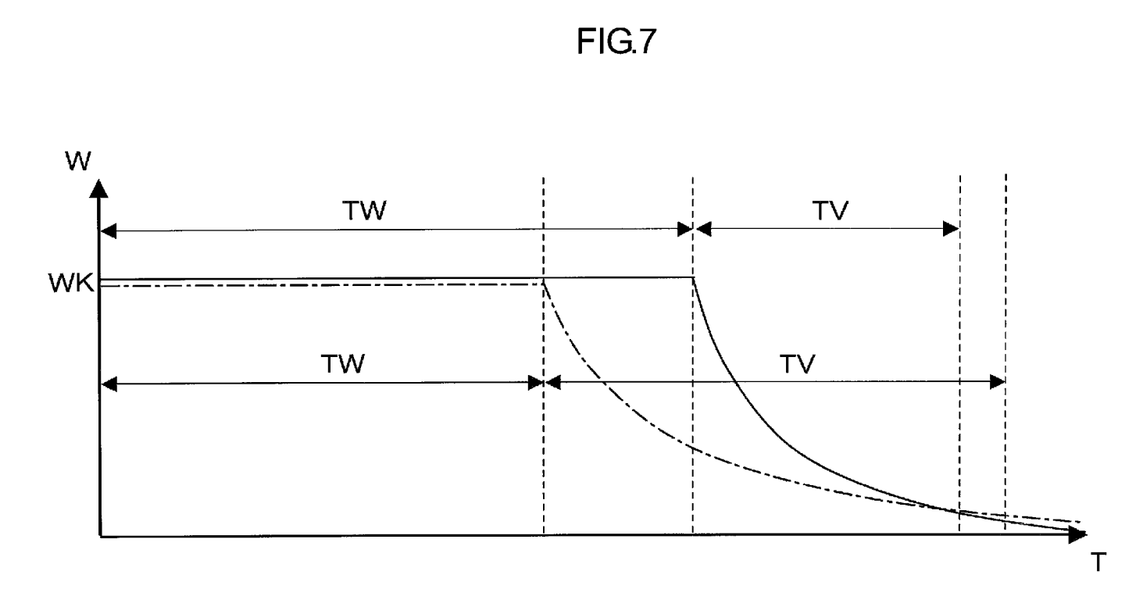
FIG. 7 is a graph illustrating variations in powers supplied to the second batteries during the condition determination process.

As illustrated in FIG. 7, the current flowing through the secondary battery 12 and the power supplied to the secondary battery 12 decrease during the constant voltage charge. The secondary battery 12 requires longer constant voltage charging time TV as the deterioration progresses but shorter constant power charging time TW.

In the charging device 10, the determination value J is calculated based on the constant power charging time TW and the constant voltage charging time TV. Therefore, a variation in the determination value J due to the deterioration of the secondary battery 12 is larger than a variation in the constant power charging time TW or the constant voltage charging time TV due to the deterioration of the secondary battery 12.

With this configuration, the condition of the secondary battery 12 can be accurately determined.

Other Embodiments

The scope of the present invention is not limited to the above embodiments. The following embodiments are also included in the scope of the present invention.

(1) The charging device 10 includes a single BMS 20 and a single CPU 30 in the BMS 20. The single CPU 30 includes the timer portion 40, the control portion 42, and the determination portion 44. However, the scope of the present invention is not limited to the charging device 10 having such a configuration. For instance, the charging device 10 may include a plurality of CPUs or hardware circuits for timer, control, and determination functions, respectively. Such hardware circuits may be application specific integrated circuits (ASICs). Furthermore, a combination of CPU(s) and ASIC(s) may be used for timer, control, and determination functions.

(2) In the above embodiments, the determination value J is calculated by dividing the constant voltage charging time TV by the constant current charging time TC. However, a determination value calculated in a different way can be used. For instance, the determination value can be calculated as follows: (i) dividing the constant current charging time TC by the constant voltage charging time TV; (ii) subtracting the constant current charging time TC from the constant voltage charging time TV; (iii) subtracting the constant voltage charging time TV from the constant current charging time TC; (iv) dividing the constant voltage charging time TV by a total charging time TM that is a sum of the constant voltage charging time TV and the constant current charging time TC; and (v) dividing the constant current charging time TC by the total charging time TM.

$$J=TC/TV \qquad \text{(i)}$$

$$J=TV-TC \qquad \text{(ii)}$$

$$J=TC-TV \qquad \text{(iii)}$$

$$J=TV/TM \qquad \text{(iv)}$$

$$J=TC/TM \qquad \text{(v)}$$

(3) In the above embodiments, the voltage V of the secondary battery 12 before being charged and the SOC is obtained based on the voltage V. However, the SOC can be obtained in a different way. For instance, the secondary battery 12 may remain connected to the charging device 10 during use and the CPU 30 may continuously measure the current I flowing into or out of the secondary battery 12 using the ammeter 22. In such a case, the SOC can be obtained by multiplying the currents I.

(4) In the above embodiments, the comparative determination value H is calculated by dividing the determination value J by the previous determination value JO for determining the condition of the secondary battery 12. However, the comparative determination value H can be calculated in a different way. For instance, the comparative determination value H can be calculated by diving the previous determination value JO by the determination value J. The comparative determination value H may be calculated from the difference between the determination value J and the previous determination value JO. The comparative determination value H may be calculated by dividing the difference between the determination value J and the previous determination value JO by the previous determination value JO. The comparative determination value H may be calculated by dividing the difference between the determination value J and the previous determination value JO by the determination value J.

(5) In the above embodiments, the CPU 30 measures the charging time including the constant current charging time TC and the constant voltage charging time TV using the timer portion 40. The CPU 30 starts the measurement of the charging time when the current I monitored with the measurements of the ammeter 22 in the BMS 20 or the voltage V monitored with the measurements of the voltmeter 24 in the BMS 20 satisfy a certain condition. The BMS 20 may be connected to an external device such as an electronic control unit (ECU) in a vehicle via an input unit. The CPU 30 may measure the charging time using the timer portion 40 according to a signal input from the external device at the start or the end of the constant current charge, the constant voltage charge, or the constant power charge.

(6) The measurement of the charging time by the CPU may not be required. For instance, the BMS 20 may be connected to an external device such as an ECU in a vehicle via an input unit. The CPU 30 may obtain the charging time according to an input regarding the charging time from the external device.

(7) In the above embodiments, the fully discharged condition is set as a reference condition. However, any condition can be set as a reference condition. In such a case, the reference value D may be set according to the SOC in the reference condition.

What is claimed is:

1. A condition determination device for determining a condition of an electric storage device, the condition determination device comprising:
    a current detector configured to detect a charging current for charging the electric storage device;
    a voltage detector configured to detect a charging voltage for charging the electric storage device; and
    a controller configured to:
        determine a level of a first electric factor based on at least one of the charging current detected by the current detector and the charging voltage detected by the voltage detector;
        obtain a first charging time while the level of the first electric factor is constant;
        determine a level of a second electric factor based on the charging voltage detected by the voltage detector;
        obtain a second charging time while the level of the second electric factor is constant;
        calculate a determination value based on the first charging time and the second charging time; and
        determine a condition of the electric storage device based on the determination value.

2. The condition determination device according to claim 1, wherein the controller calculates the determination value by diving one of the first charging time and the second charging time by the other one of the first charging time and the second charging time.

3. The condition determination device according to claim 1, wherein the controller further configured to:
    obtain an initial value that is a state of charge (SOC) of the electric storage device at a start of measurement of the first charging time;
    subtract the initial value from 100%;
    obtain a reference SOC of the electric storage device in a reference condition;
    calculate a reference value by subtracting the reference SOC from 100%;
    calculate a correction value by dividing the reference value by a result of the subtraction;
    calculate a correction charging time by multiplying the first charging time by the correction value; and
    calculate the determination value based on the correction charging time and the second charging time.

4. The condition determination device according to claim 1, further comprising a memory unit, wherein the controller performs the calculation of the determination value a plurality of times to obtain determination values in the respective times of the determination, the controller being configured to:
    associate numbers of times of the determination with the respective determination values calculated in the respective times of the determination;
    store the determination values with the associated numbers in the memory unit;
    compare a currently calculated determination value with a previously calculated determination value to obtain a comparison result; and
    determine a condition of the electric storage device based on the comparison result.

5. The condition determination device according to claim 1, wherein the controller is further configured to calculate the determination value by subtracting one of the first charging time and the second charging time from the other one of the first charging time and the second charging time.

6. The condition determination device according to claim 1, wherein the controller is further configured to:
    calculate a total charging time by adding the first charging time and the second charging time; and
    calculate the determination value by dividing the first charging time by the total charging time.

7. The condition determination device according to claim 1, wherein the controller is further configured to:
    calculate a total charging time by adding the first charging time and the second charging time; and
    calculate the determination value by dividing the second charging time by the total charging time.

8. The condition determination device according to claim 1, wherein the first electric factor is a current determined based on the charging current detected by the current detector.

9. The condition determination device according to claim 1, wherein the first electric factor is a power determined based on the charging current detected by the current detector and the charging voltage detected by the voltage detector.

10. An electrically chargeable device comprising:
    an electric storage device; and
    the condition determination device according to claim 1.

11. A computer-implemented method of determining a condition of an electric storage device, the method comprising:
    measuring a charging current and a charging voltage of the electric storage device;
    determining a level of a first electric factor based on at least one of the charging current and the charging voltage;
    obtaining a first charging time while the first electric factor is constant during charging the electric storage device;
    determining a level of a second electric factor based on the charging voltage;
    obtaining a second charging time while the second electric factor is constant during charging the electric storage device after obtaining the first charging time;
    calculating a determination value based on the first charging time and the second charging time; and
    determining a condition of the electric storage device based on the determination value,
    wherein the method steps are performed by a processor.

12. The method according to claim 11, wherein the calculating step includes dividing one of the first charging time and the second charging time by the other one of the first charging time and the second charging time.

13. The method according to claim 11, further comprising:
obtaining an initial value that is a state of charge (SOC) of the electric storage device at a start of measurement of the first charging time;
subtracting the initial value from 100% to obtain a subtraction result;
obtaining a reference SOC of the electric storage device in a reference condition;
calculating a reference value by subtracting the reference SOC from 100%;
calculating a correction value by dividing the reference value by the subtraction result;
calculating a correction charging time by multiplying the first charging time by the correction value; and
calculating the determination value based on the correction charging time and the second charging time,
wherein the method steps are performed by the processor.

14. The method according to claim 11, wherein the calculating step of the determination value is performed a plurality of times to obtain determination values in respective times of the determination, the method further comprising:
associating numbers of times of the determination with the respective determination values calculated in the respective times of the determination;
storing the determination values with the associated numbers in a memory unit;
comparing a currently calculated determination value with a previously calculated determination value to obtain a comparison result; and
determining a condition of the electric storage device based on the comparison result,
wherein the method steps are performed by the processor.

15. The method according to claim 11, further comprising calculating the determination value by subtracting one of the first charging time and the second charging time from the other one of the first charging time and the second charging time,
wherein the method steps are performed by the processor.

16. The method according to claim 11, further comprising:
calculating a total charging time by adding the first charging time and the second charging time; and
calculating the determination value by dividing the first charging time by the total charging time,
wherein the method steps are performed by the processor.

17. The method according to claim 11, further comprising:
calculating a total charging time by adding the first charging time and the second charging time; and
calculating the determination value by dividing the second charging time by the total charging time,
wherein the method steps are performed by the processor.

18. The method according to claim 11, wherein the first electric factor is a current determined based on the charging current detected by a current detector.

19. The method according to claim 11, wherein the first electric factor is a power determined based on the charging current detected by a current detector and the charging voltage detected by a voltage detector.

* * * * *